(12) United States Patent
Shah et al.

(10) Patent No.: US 6,289,255 B1
(45) Date of Patent: *Sep. 11, 2001

(54) METHOD FOR COMPUTER-AIDED DESIGN OF A PRODUCT OR PROCESS

(75) Inventors: Sunil C. Shah, Mountain View; Pradeep Pandey, San Jose, both of CA (US)

(73) Assignee: Voyan Technology, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/199,708

(22) Filed: Nov. 24, 1998

Related U.S. Application Data

(63) Continuation of application No. 08/977,781, filed on Nov. 25, 1997, now Pat. No. 5,880,959.

(51) Int. Cl.$^7$ .................................................. G06F 19/00
(52) U.S. Cl. .......................... 700/97; 700/105; 700/121
(58) Field of Search ..................... 700/33, 53, 36, 700/97, 98, 274, 266, 121, 104, 83, 105, 165, 182; 705/8; 703/1, 2; 716/1, 2, 4, 9, 10; 706/903, 904, 919, 920, 921

(56) References Cited

U.S. PATENT DOCUMENTS

| | | | |
|---|---|---|---|
| 5,202,837 | 4/1993 | Coe et al. ............................ | 364/476 |
| 5,280,425 | 1/1994 | Hogge ................................. | 364/402 |
| 5,495,419 | 2/1996 | Rostoker et al. ..................... | 364/468 |
| 5,572,430 | 11/1996 | Akasaka et al. ................. | 364/468.01 |
| 5,729,466 | 3/1998 | Bamji .................................... | 364/488 |
| 5,888,959 | * 3/1999 | Shah et al. ............................ | 700/97 |
| 5,969,973 | * 10/1999 | Bourne et al. ....................... | 700/165 |

OTHER PUBLICATIONS

Sunil C. Shah et al., "Computer–Aided Control Systems Engineering", 1985, pp 181–207.

Judea Pearl, "Heuristics: Intelligent Search Strategies for Computer Problem Solving,", 1984, pp 33–70.

Judea Pearl, "Probablistic Reasoning in Intelligent Systems: Networks of Plausible Inference", (revised second printing), 1988, pp 289–331.

PCT International Search Report for PCT/US98/25290 mailed Apr. 1, 1999.

* cited by examiner

Primary Examiner—Paul P. Gordon
Assistant Examiner—Steven R. Garland
(74) Attorney, Agent, or Firm—Blakely, Sokoloff, Taylor & Zafman

(57) ABSTRACT

A method for computer-aided design. The method includes the steps of representing a computer-aided design activity as a design cycle and defining a goal of the design activity. The method also includes the steps of defining alternate design steps toward achieving the goal. According to one embodiment, the design activity is represented as a graph containing the alternate design steps. According to this embodiment, a cost metric is assigned for each of the alternate design steps that includes elements representing relative costs of taking each of a plurality of paths in the graph. Element values and bounds on the cost metric are the determined by searching the graph to project costs incurred upon execution of each of the alternate design steps to achieve the goal. The cost of achieving the goal is then optimized by selecting one of the alternate design steps associated with a smallest cost metric.

43 Claims, 9 Drawing Sheets

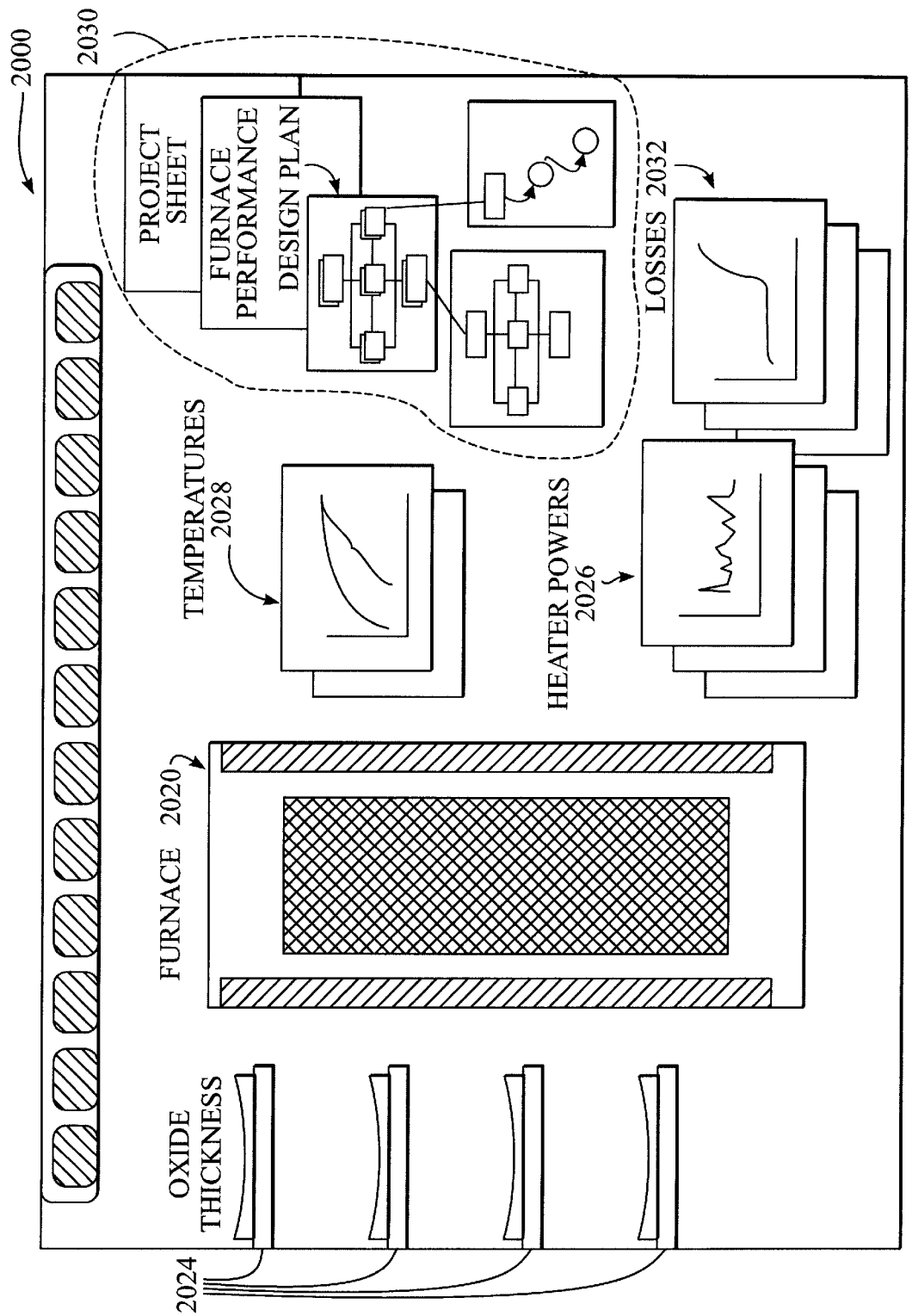

Fig. 9b

Project Sheet 902

Additional Required | Expended

| Furnace Test Time | 120 | 80 | hours |
| Engineering Time | 300 | 400 | hours |
| Elapsed Project Time | 200 | 200 | hours |

Current Design | Limit

| Real-Time CPU Loading | 25% | 50% |

METHOD FOR COMPUTER-AIDED DESIGN OF A PRODUCT OR PROCESS

The present application is a continuation under 37 C.F.R. §1.53(b) of U.S. application Ser. No. 08/977,781 filed on Nov. 25, 1997 now issued as U.S. Pat. No. 5,880,959.

FIELD OF THE INVENTION

The present invention is in the field of methodologies for engineering design activities, and more particularly in the field of methodologies for computationally intensive signal processing design or control system design activities.

BACKGROUND OF THE INVENTION

Design of new products is becoming an increasingly complex activity because of reliance on high performance features requiring signal processing and feedback control. Many industries today also rely on complex processes to produce a product. For example, the semiconductor industry uses extremely complicated processes to produce products that typically have very narrow tolerances for final product characteristics. This situation presents a challenge for those designing products and control systems, in part because the design process is very computationally intensive. Similar challenges exist in any area where a complex product must be designed and its final characteristics tightly controlled. Current methodologies for design of products and control systems are inadequate in several respects. For example in the area of control of manufacturing processes or control of product behavior, standard control methods are currently used. Many modern products and manufacturing processes, however, are too complex for standard control methods to satisfactorily control them. Typical prior design methods are linear plans that do not provide alternatives required by the uncertainty of outcomes of computations and tests, and then permit planning based on resource utilization. Also, these prior methods do not incorporate actual experienced results of process execution and adjust projections accordingly.

It is difficult, if not impossible, to achieve satisfactory results using prior methods. There are many problems in applying such methods to complicated manufacturing processes or control of behavior of high performance products.

Prior methods implemented in design tools are not effective for several reasons. For example, prior design tools typically automate linear fragments of the design activity. Results of design steps are thus unknown or uncertain before the steps are actually carried out. For instance compute time, computational errors and exceptions, and results of physical tests cannot be known in advance to aid in decision making. These prior tools require a user to make a large number of complex decisions that depend on results of many previous steps. This is a disadvantage because the user must usually possess specific knowledge or skills in order to properly use the information gained from execution of previous steps. It is a further disadvantage because intelligent decisions can only be made and incorporated after waiting for execution of design steps. No problem-specific guidance is available from prior tools for projecting with any accuracy what the results of design steps will be.

Prior design steps can become infeasible or highly suboptimal because of a user decision made many steps back. Prior design tools cannot help the user see future implications of current decisions. For these reasons, with prior tools, the user must learn by problem-specific experience, over a long period of time, to resolve unknowns and dependencies across design steps.

The problem of adequate control of complex processes is further exacerbated by a current division and separation of skill sets among those involved in the design process. For instance, control experts often do not have an in-depth knowledge of the process they are seeking to control. In addition, the proprietary nature of the processes often does not allow for acquisition of an in-depth knowledge of the process. On the other hand, process experts may know conventional control methods but do not know advanced control methods. Existing control design tools are designed for control experts, but are not suitable for process experts.

Experienced control scientists have found ways to sidestep or solve these problems in specific cases. Significant shortcomings still surface, however, when less experienced control designers or team members from other disciplines apply existing software tools to manufacturing problems. Consequently, current tools are inadequate for widespread use.

Most existing software design tools simply automate fragments of standard design methods. In general, the tools are ineffective when applied to control of manufacturing processes for the reasons described above. FIG. 1 illustrates a conventional process design paradigm. FIG. 1 is a specific example of design of a controller for a thermally activated process. In the conventional paradigm of FIG. 1, scientists 102, process experts 108 and control experts 114 work within different domains with different tools. Scientists 102 typically operate in the domain of thermal models 104 using tools such as Fortran TWOPNT 106 (Grcar, J., *The TWOPNT Program for Boundary Value Problems*, Sandia National Laboratories, SAND 91–8230, April, 1992). Process experts 108 typically deal with the domain of process monitoring 110 using a tool such as Lab View® 112 (available from National Instruments, Austin, Tex.). Control experts 114 are typically concerned with the domain of temperature control 116 and use tools such as MATRIX$_X$® 118 (available from Integrated Systems, Inc., Sunnyvale, Calif.), or MATLAB® 118 (available from Mathworks, Inc., Natick, Mass.). Efficient control requires an integration of information from each of domains 104, 110 and 116 in an easily usable format, which typically does not occur in current design tools.

SUMMARY AND OBJECTS OF THE INVENTION

The present invention provides a method for designing high performance products incorporating signal processing and feedback control. In one embodiment, a design problem is represented by a design cycle, and the design cycle is converted to a graphical representation including a cost metric associated with each possible path in the graph. Initially, bounds, or ranges for the metrics are developed by searching the graph and determining outcomes of taking different paths. Based on a cost metric, an optimum path through the graph is computed. During execution of the design cycle, actual result values are used to iteratively reestimate bounds on the cost metric and choose optimum paths, providing dynamic design that continually minimizes costs. In one embodiment, a cost metric is prioritized so that certain elements of the cost metric are minimized at the expense of others.

In one embodiment, the present invention is a software tool for controlling thermally activated processes. This embodiment includes a user interface that allows scientists, process experts, and control experts to readily design, simulate, monitor and control processes without low level knowledge of a design method or of the process to be controlled.

It is an object of the invention to provide a tool for design of processes and products incorporating signal processing that reduces cost of design and implementation.

It is object of the invention to provide a design methodology that considers the structure of a design cycle, and converts the design cycle into a weighted graph.

It is another object of the present invention to assign a cost metric to a transition between design states in the graph, wherein a cost metric represents objective cost elements of the design process.

It is another object of the present invention to use the assigned cost metric to determine an optimum path through the design cycle.

It is a further object of the invention to provide a dynamic methodology for design that factors in results of execution of steps in the design process as the process is ongoing by recalculating a cost metric and determining new optimum paths.

BRIEF DESCRIPTION OF THE DRAWINGS

FIG. 8 is an illustration of an interface screen of one embodiment that displays design information.

FIG. 9b is an is an illustration of another interface screen of one embodiment that displays application-specific information.

DETAILED DESCRIPTION

In the following detailed description of the present invention numerous specific details are set forth in order to provide a thorough understanding of the present invention. However, one skilled in the art may practice the invention without these specific details. In some instances, well known methods, procedures, and components have not been described in detail to avoid obscuring the present invention.

The present invention will be described in terms of a particular embodiment for designing control procedures for the equipment used in thermally activated processes. Other embodiments of the present invention find application in any computationally intensive design activity, for example, design of a product comprising signal processing or feedback control.

Figure 1:
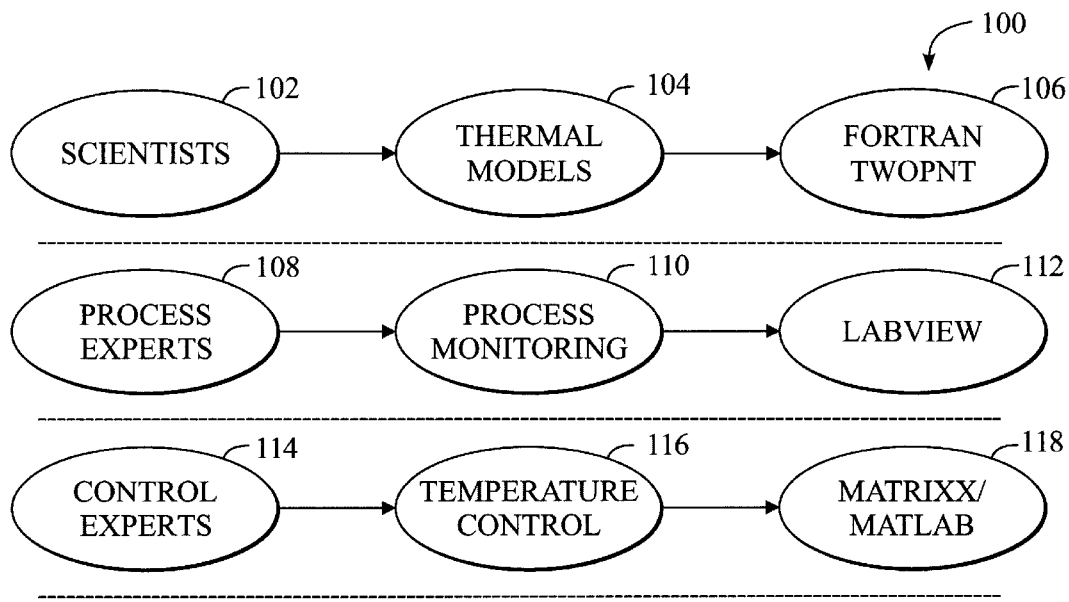
FIG. 1 is a diagram of a prior process design paradigm.
Figure 2:
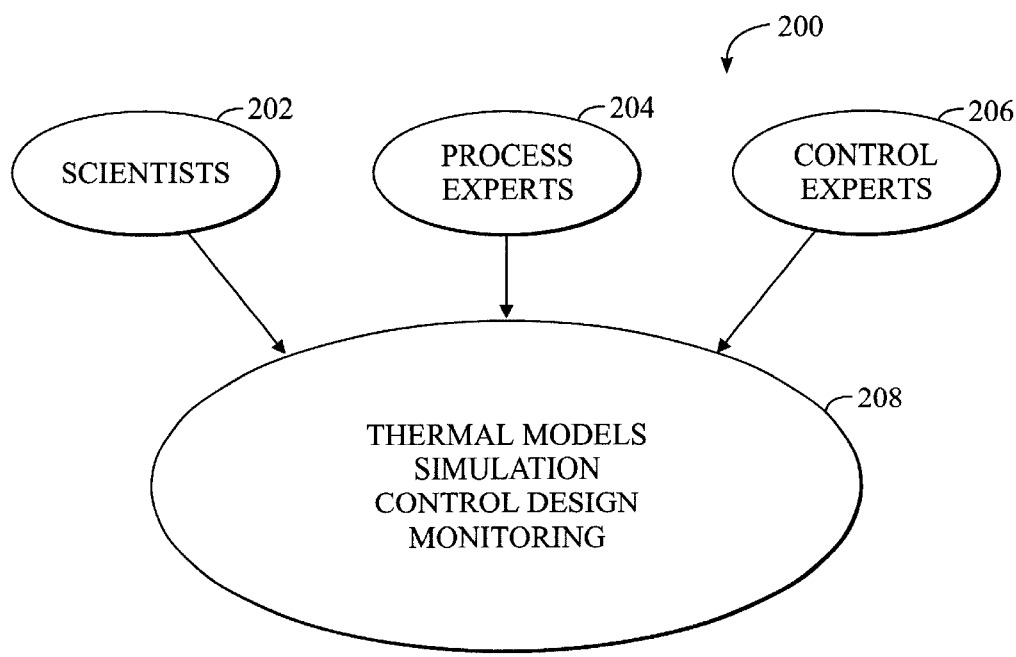
FIG. 2 is a diagram of a design paradigm according to one embodiment of the invention.

FIG. 2 is a diagram of paradigm 200 of one embodiment of the present invention. According to paradigm 200, scientist 202, process experts 204, and control experts 206 all have access to design tools 208. Design tools 208 incorporate information from various technical disciplines to aid in the engineering design activity. Design tools 208 include thermal models, simulation algorithms, control design tools, and tools for process monitoring. According to paradigm 200, the present invention provides software tools that allow complete design iterations in a shorter time and by less specifically skilled personnel than prior methods.

According to one embodiment, the major steps of an entire design cycle are identified. The logical structure of the design cycle is then exploited by describing each step in detail and by providing alternative methods for solving each step of the design cycle, thus eventually solving the complete design problem. One of the alternative methods is automatically chosen by evaluating estimated cost metrics associated with the alternatives. As the design cycle is executed, actual results of using particular methods for particular steps are used to dynamically reestimate cost metrics and choose future methods.

Figure 3:
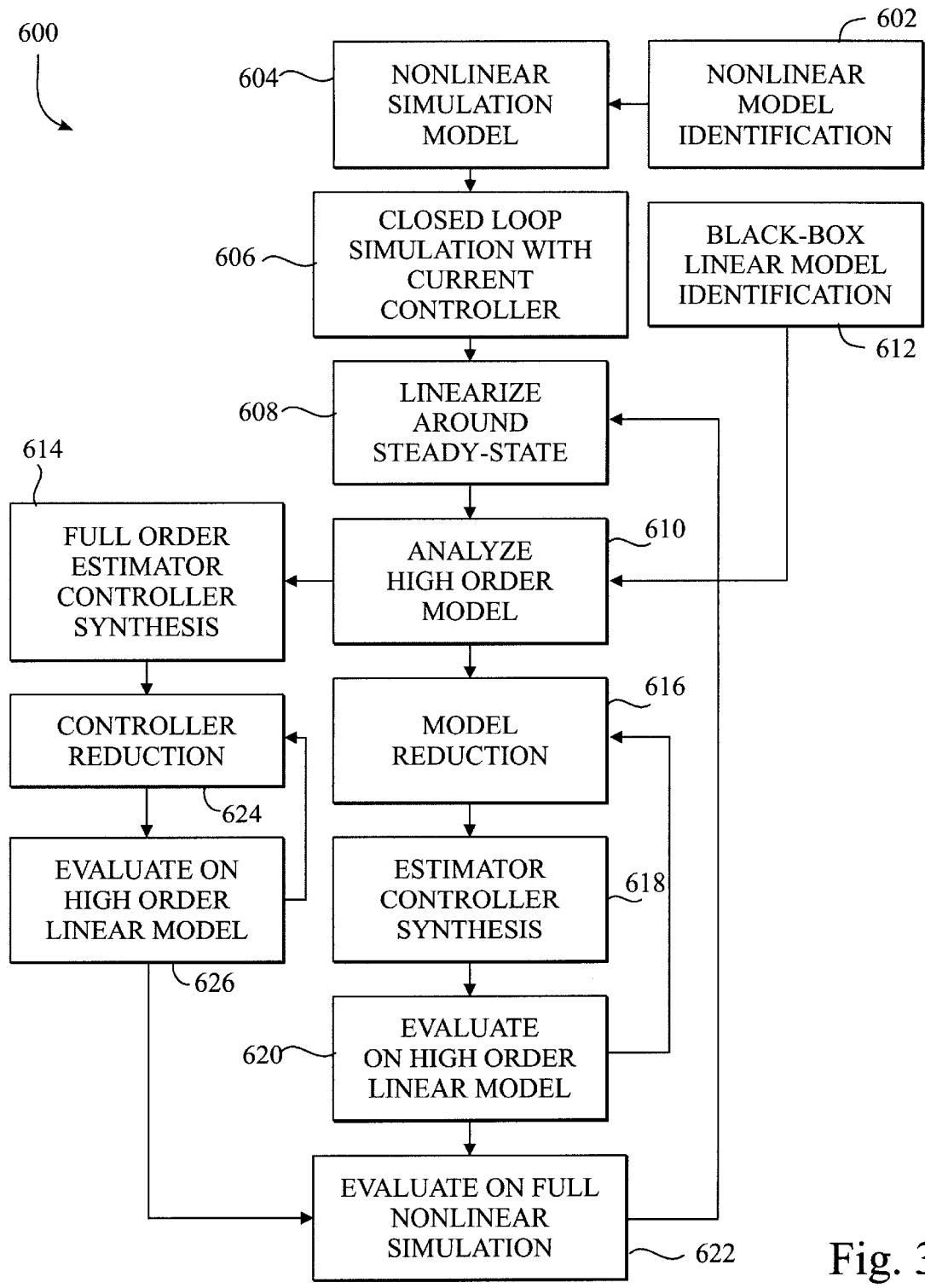
FIG. 3 is a diagram of the logical structure of a design cycle according to one embodiment.

FIG. 3 is a diagram of the logical structure of an example design cycle 600 of one embodiment, which represents a design cycle for a process controller. Design cycle 600 includes major steps for design of a controller for a thermally activated process. In this embodiment, the thermally activated process is silicon oxide growth carried out in an oxidation furnace as in the semiconductor industry. Typically, during higher level iterations involving implementation and model refinement, the steps of design cycle 600 will be executed many times.

Referring to FIG. 3, nonlinear model identification step 602 comprises: 1) estimating uncertain parameters in a hypothesized set of ordinary nonlinear parameterized differential equations using test signals; 2) examining the validity of the hypothesized model; and 3) refining the structure and test trajectories to attain the desired degree of predictability from the nonlinear model.

Nonlinear simulation model step 604 comprises creating a computational simulation model consisting of a set of nonlinear ordinary differential equations such that the computational model can numerically integrate the equations given initial states, input signals and noise process trajectories. Closed loop simulation with a current controller step 606 includes a computational closed loop simulation model where a set of control loops with a currently existing controller are closed around the nonlinear simulation model of step 606.

Step 608 of linearizing around a steady-state includes computing a steady-state condition of the closed loop simulation with the current controller, then computing the linearized differential equations around the steady-state condition by numerical differentiation of nonlinear simulation model 604.

Step 610 of analyzing the high order model comprises computing the multivariable frequency responses, step responses, responses to stochastic noise processes and eigenvalues of the linearized differential equations from step 608. In step 610, a black-box linear model previously identified in step 612 is used.

Step 612, black-box linear model identification comprises estimation of parameters in a set of linear difference equations.

Model reduction step 616 comprises computing an approximate model of the linear high order model of step 608 with a fewer number of states than the high order model. This may also provide an estimate of errors due to the approximation.

Estimator controller synthesis step 618 comprises computing an estimator controller that optimizes certain properties, such as the $H_2$, H or the $\mu$ norm of the closed-loop system consisting of the reduced order model from step 616 and the estimator controller.

At step 620, the step of evaluating on the high order linear model includes computing multivariable frequency responses, step responses, responses to the stochastic noise processes, eigenvalues and measures of robustness for the closed system consisting of the high order model from step 608 and the estimator controller from step 618.

Full order estimator controller synthesis step 614 comprises computing an estimator controller that optimizes certain properties, such as the $H_2$, H or the $\mu$ norm of the closed-loop system consisting of the high order model from step 608 and the estimator controller.

Controller reduction step 624 comprises computing an approximate estimator controller of the full order estimator controller of step 614 with fewer states than the full order estimator controller.

Step 626 of evaluating on the high order linear model includes computing multivariable frequency responses, step responses, responses to stochastic noise processes, eigenvalues and measures of robustness for the closed system consisting of the high order model from step 608 and the reduced order model from step 624.

Step 622 of evaluating on the full nonlinear simulation includes: 1) replacing the current controller in the closed loop simulation of step 606 with the estimator controller from step 618 or from step 624; 2) running non-linear closed-loop simulations for various initial values and perturbed model parameters.

Each step of the design cycle of FIG. 3 may potentially be executed by alternative methods. For example model reduction step 616 may be performed using the methods listed in Table 1.

Figure 4:
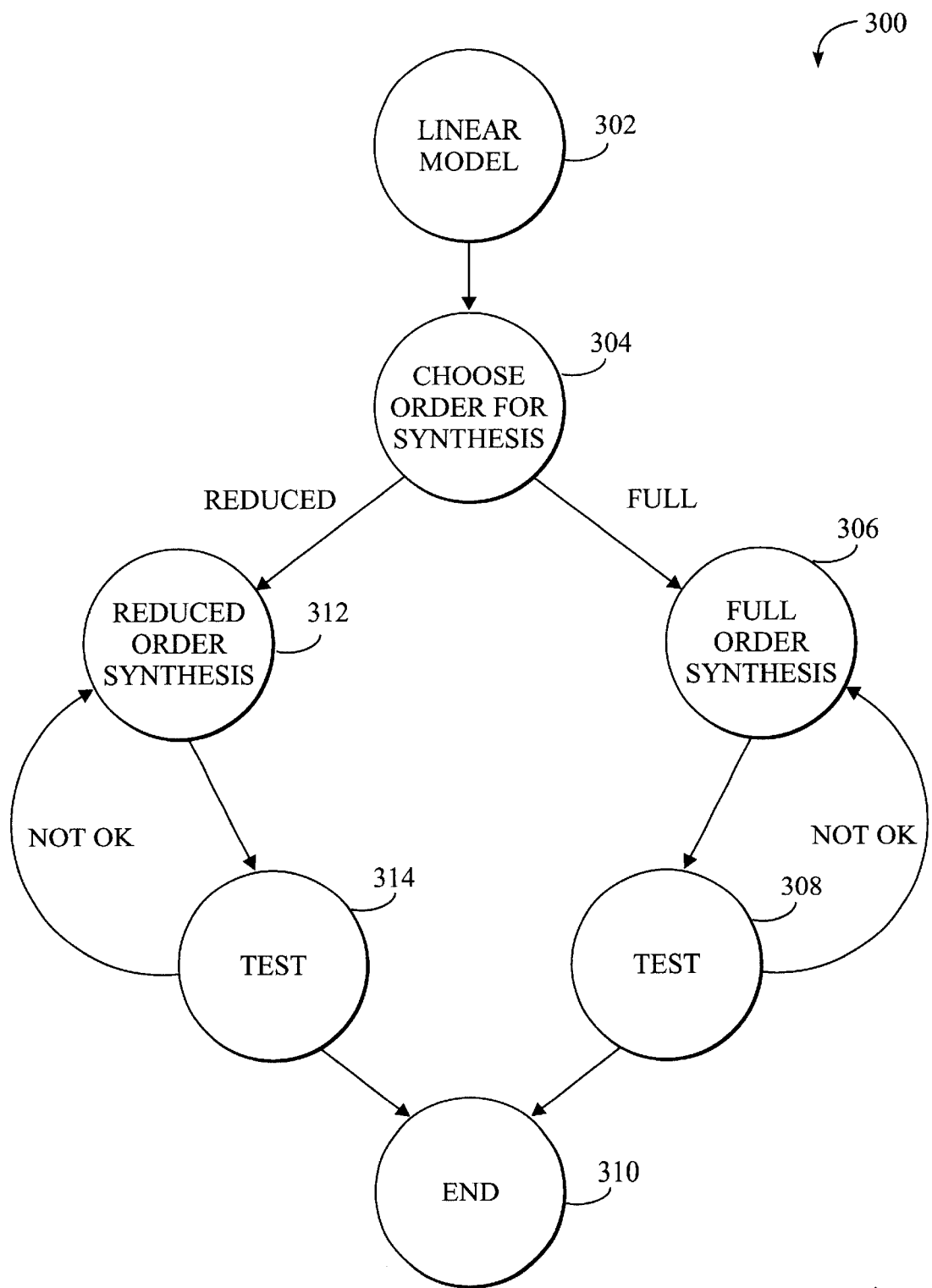
FIG. 4 is a diagram of very simplified design cycle according to one embodiment.

FIG. 4 is a diagram of very simplified design cycle 300. Design cycle 300 is simpler than a design cycle which would actually be created by the present invention in realistic applications, but design cycle 300 is useful to illustrate the manner in which one embodiment of the invention exploits the design cycle to solve the design problem. Design cycle 300 is a design cycle for the single step 616 of controller synthesis as in FIG. 3.

A linear model is identified at step 302 of design cycle 300. Then, a choice must be made at step 302 between performing synthesis on a full order model or a reduced order model. In this context, order refers to a number of states in the model. In some cases, a model used in solving a design problem, for instance a finite element model, may have thousands of states. Full order models with many states require more computing time and resources to simulate, but may simulate more accurately than a reduced order model.

As a specific example, consider design cycle 300 as the design cycle of a process controller and further consider the step of synthesizing a particular type of controller, a linear quadratic (LQ) controller using a linearized model. The decision whether to proceed with synthesis using the full model or compute a reduced order model is an important one. Currently, most users, including many control experts, proceed in a rather ad hoc manner rather than evaluating the cost and benefits of the choices available. Existing tools provide little or no guidance in this matter. According to this embodiment of the invention, the factors involved in this decision are carefully weighed. These factors include computational costs, complexity of user interaction, and costs associated with loss of productivity due to computational delays. Table 2 summarizes key parameters associated with computational costs.

TABLE 1

| Method | Applicability | Compute Costs | Reliability |
|---|---|---|---|
| Orthogonal Kalman Decomposition | Works without regard to stability. Very sensitive to scaling. | $2.6 N^3 + 6.5 N^2$ | Poor |
| Balanced Realization | Requires stability. Gives $H_\infty$ error bound | $50 N^3$ | Good |
| Schur Decomposition of Grammian Product | Requires stability, Gives $H_\infty$ error bound | $50 N^3$ | Excellent |
| Hankel Norm Reduction | Requires stability. Tighter $H_\infty$ error bounds than with Balanced Realization | $50 (N^3 + (N-1)^3 + (N-2)^3 \ldots)$ | Good |
| Modal Decomposition | Does not require stability. No bounds on $H_\infty$ errors. Relies on time scale separation | $20 N^3$ | Good |

As will be further described, embodiments of the present invention choose among methods for executing design cycle steps based on estimations of cost metrics associated with various paths of the design cycle. Because such choices are intelligently made by the present invention, a user does not need to be knowledgeable about different methods of performing certain steps in order to create an efficient design using the present invention.

TABLE 2

| | | |
|---|---|---|
| cost of synthesis | $c_1$ | $80n^3$ |
| cost of model reduction | $c_2$ | $80n^3$ |
| typical number of iterations in synthesis step | $m_1$ | 10 |
| number of iterations in reduced-order/full-order step | $m_2$ | function of relative model error |

TABLE 2-continued

| | | |
|---|---|---|
| frequency response calculations (assume 200 frequency points) | $c_3$ | $200n^3$ |
| closed-loop step response calculations | $c_4$ | $20n^3$ |

With reference to Table 2, suppose $n_f$ and $n_r$ are sizes of the full order and reduced order models, respectively. Then the cost associated with each path is:

full order path:

$$cost = m_1*(80n_f^3 + 200n_f^3 + 20n_f^3)$$

reduced order path:

$$cost = m_1*m2*(80n_r^3 + 200n_r^3 + 20n_r^3) + 80n_f^3$$

Now suppose the size of the full order model is 200 states and we want to choose a reduced order model size of 30 states. Based on calculated relative model error, $m_2$ is 2. Then the complexity of the full order path is 3.8E10 compared to 1E9 for the reduced order path, or an order of magnitude difference in complexity.

Tradeoffs therefore must be weighed in choosing to simulate a full order versus a reduced order model in the step of controller model synthesis. If reduced order synthesis is chosen it is performed at step 312 of design cycle 300, then tested at step 314 on the full order model. If the results found at test step 314 show that the of step 312 is repeated. Similarly, if full order synthesis is chosen then it is performed at step 306. The full order synthesis is tested at step 308 and if it is not found to be satisfactory full order synthesis of step 306 is repeated. When either test 314 or 308, as applicable, indicates that model synthesis has yielded satisfactory results then the design cycle is at end 310.

Figure 5:
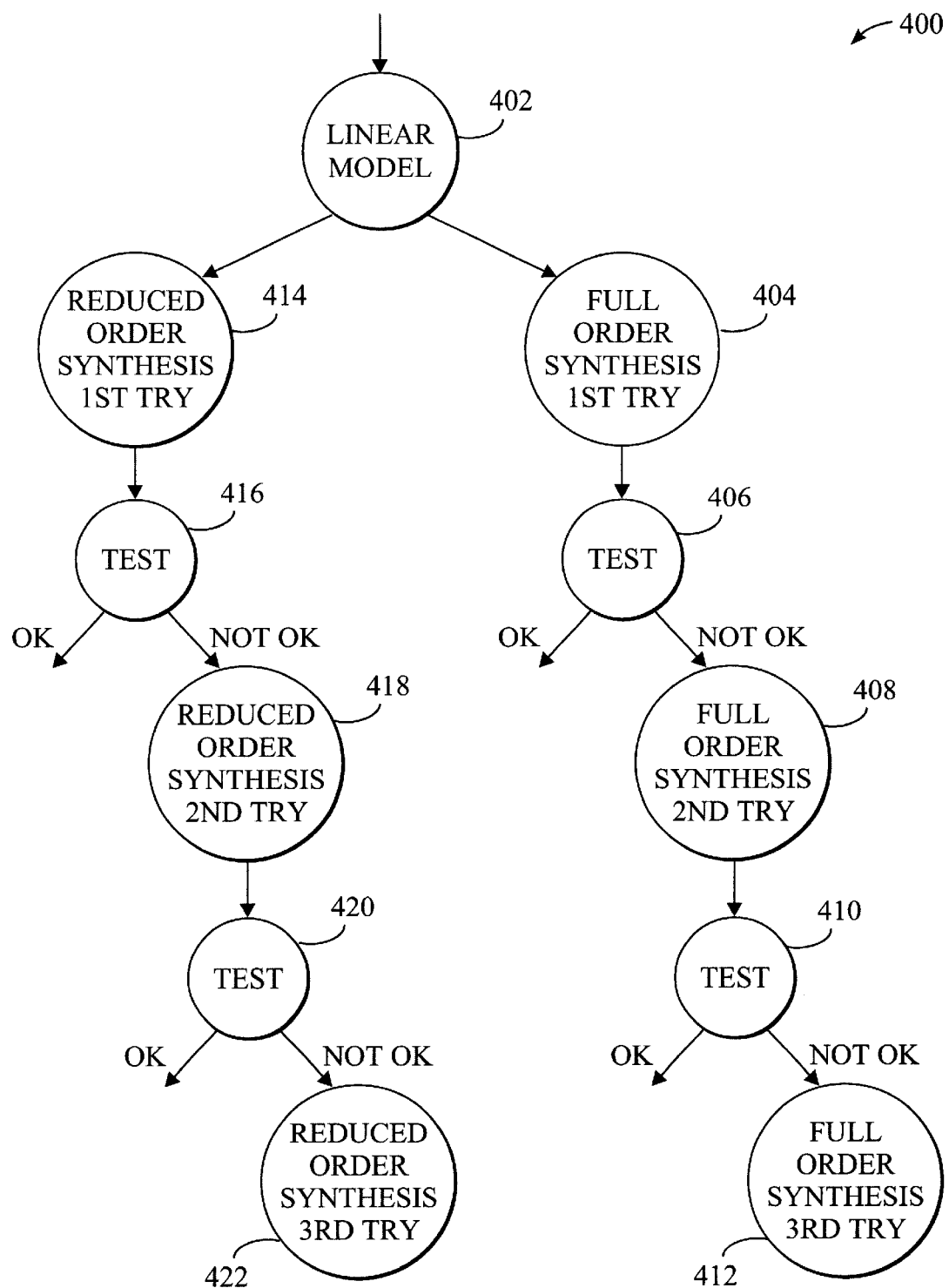
FIG. 5 is a graphical representation of the design cycle of FIG. 4 according to one embodiment.

FIG. 5 is a diagram of state space graph representation 400 of design cycle 300. According to one embodiment, design cycle 300 is used to create a weighted graph representation 400 which is a state space graph. In other embodiments, other weighted graphs could be used, for example, an AND/OR graph could be used. In yet another embodiment, a Bayesian network is used. In yet other embodiments, alternative methods of representing a graph are used, such as incident matrices, linked lists, and recursive functions. Search on a graph, in one embodiment, is represented as a set of if-then-else rules, and in another embodiment as production in a production system.

In the embodiment of FIG. 5, weights are assigned to each arc of the state space graph. In this embodiment, a weight is a cost metric defined for the design problem. In this particular embodiment which is used to design a controller for a thermally activated process, the cost metric is a function of: interaction complexity, which is a measure of an amount of information to be processed by a user for a transaction between the user and a user interface of the design tool; a computational complexity that is an indication of a number of computational operations to be performed in a computational task; a response time that indicates how long it takes a machine performing the calculation to complete it; a number of required user decisions in an interaction between the user and the interface; and a measure of time to test physical equipment. For example, a cost metric for one application is equal to the weighted sum of compute time (c1), numerical accuracy (c2), and test time (c3) for some user configurable value of c1, c2, and c3. Additional inputs to the cost metric may be included in other embodiments as needed to fully characterize the steps.

Figure 6:
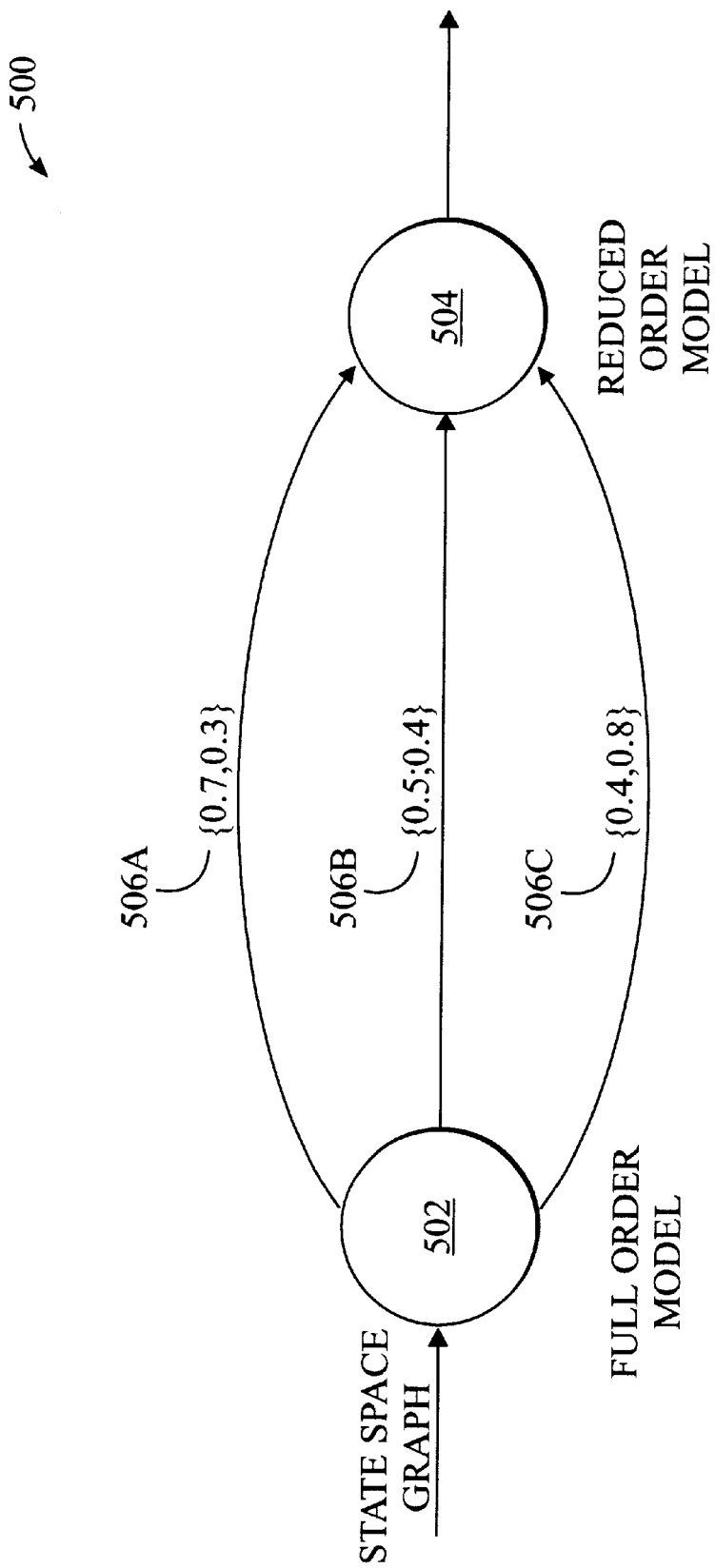
FIG. 6 is an example of a fragment of a weighted graph such as the graph of FIG. 5 according to one embodiment.

FIG. 6 is an example of a fragment 500 of a weighted graph such as the state space graph of FIG. 5. Fragment 500 of a state space graph is weighted with quantified metrics 506a, 506b and 506c that represent the costs and bounds on costs associated with different paths between full model 502 and reduced order model 504. Each of metrics 506a, 506b and 506c are vectors in this embodiment. Quantified metrics 506a, 506b and 506c are automatically calculated and assigned to a proper path on a state space graph. Total estimated costs of various choices in the design process can then be used to optimize the process, that is, make optimum decisions when executing the process. As the design is being executed, the present invention replaces estimated costs with actual experienced costs and then performs ongoing reestimates of costs and reoptimization of design paths. In one embodiment, incremental algorithms are used which take results of calculations related to one iteration of the design cycle and use those results in making calculations relating to subsequent iterations. Incremental algorithms are discussed in Pandey, P., *Quasi-Newton Algorithms for Solving an Algebraic Riccati Equation*, Proceedings American Control Conference, Chicago, June 1992.

Returning to FIG. 5, state space representation 400 of design cycle 300 includes specific steps and substeps identified for design cycle 300. Each transition between states of state space graph 400 is assigned metrics as previously described.

The metrics are not shown for clarity. Starting at step 402 with the linear model that has been identified for the design cycle, either a full order synthesis path or a reduced order synthesis path may be taken. The full order synthesis path begins with a first try at full order synthesis of a controller at step 404. Step 404 is followed by a test of the controller on the full order model at step 406. If the test is not successful, that is, if the test reveals that the controller is not adequate according to given requirements, a second full order synthesis is attempted at step 408. The results of this synthesis are tested on the full order model at step 410. If the test is not successful a third try at full order synthesis is attempted at step 412, and so on. Similarly, if a reduced order model is chosen, reduced order synthesis is initially attempted at step 414. The results of the reduced order synthesis are tested on the full order model at step 416. The process is repeated as described with respect to the full order synthesis path. Metrics representing costs are associated with each path shown in state space representation 400. The metrics are used to estimate a cost based upon which a user can choose between full order synthesis and reduced order synthesis.

State space representation 400 represents alternate paths in a step of controller synthesis. Similar state space graphs with metrics weighting each branch are provided according to the present invention for each step and substep in a design cycle. Thus, according to the present invention, the design planning problem is viewed as a search problem on a state space graph. Planning state information includes current costs and estimated cost-to-go. Search knowledge during execution of the design reveals information used to prune out certain subgraphs. For example, a subgraph whose execution would produce an unbearable cost is pruned. Similarly, unsolvable paths are pruned.

According to one embodiment, domain specific knowledge is exploited to focus on a specific domain of application. As an example, for one embodiment, advanced control is applied to hot-wall thermal reactors such as those used in the semiconductor industry for oxidation, diffusion, and chemical vapor deposition. In this embodiment, domain specific knowledge is used to provide process models this embodiment, domain specific knowledge is used to provide process models based on physical parameters such as dimensions of the reactor, view factors for radiative heat transfer, heat transfer coefficients for convective transfers, emissivity and transmittance properties of materials, and heat capacities. Models for sensors such as thermocouples and pyrometers, and actuators such as heaters and power supplies are also provided. In addition, this embodiment employs algorithms that exploit the structure of the provided models. For example, coefficient matrices in these model typically have a banded structure. For such matrices, efficient solvers for matrix equations and simulations are used. This embodiment also employs a computer user interface that includes terminology for the specific process in terms of variable names, units and objectives in such a way as to be meaningful to process experts in the pertinent area.

Embodiments of the present invention improve efficiency by employing algorithms that are computationally intensive and used repeatedly in the design process. Matrix equations such as Riccati and Lyapunov equations are examples. The Riccati equation forms the key computational step in designing controllers and estimators using methods such as linear quadratic gaussian (LQG) and H. Computational complexities of some key algorithms are given in Table 3.

TABLE 3

| Computational Step | Applicability | Complexity |
|---|---|---|
| Matrix equations: | | |
| a) Lyapunov equation | 1) Model reduction | $10n^3$ |
| b) Riccati equation | 1) Regulator/estimator design | $80n^3$ |
| | 2) Model reduction | |
| Simulation | | |
| a) Linear models | 1) Validate open-loop model | $20*n^3$ |
| | 2) Test linear controller on linear model | |
| b) Nonlinear models | 1) Verify controller on nonlinear model | $T*n^3$ |

Examining solving a Riccati equation in some detail demonstrates why computational efficiency can become problematic. As indicated in Table 3, this equation has a complexity of approximately $80n^3$, where "n" is number of operations. By timing a typical Riccati solver on a SUN™ workstation, the following empirical relation is found between elapsed time and the size of the problem: $T=6.5*10-4*N^3$ seconds. Using this relationship Table 4 was generated.

TABLE 4

| n | Time (sec) | Time (hrs) |
|---|---|---|
| 50 | 81 | 0.02 |
| 100 | 650 | 0.2 |
| 200 | 5200 | 1.44 |
| 500 | 81,300 | 22 |

Table 4 shows that efficiency is not an issue for small n. But when n becomes large, inefficient algorithms become a major stumbling block. In addition, this type of equation needs to be solved several times in a single design iteration.

To improve computational efficiency the present invention uses algorithms that exploit the structure of models in the domain of interest. For example, solving a set of linear equations which has no explicit structure takes approximately $n^3$ operations. By comparison, a triagonal system takes approximately $n^2$ operations. Clearly, respecting structure can lead to significant advantages. Coefficient matrices for thermal models typically have a banded structure. For such matrices, efficient solvers for matrix equations and simulations are used.

A typical design cycle requires several iterations. A single step of design cycle may itself require several iterations. The present invention uses algorithms that can use results of a previous iteration to speed up computations. Solutions to nonlinear matrix equations are obtained using iterative methods. For example, an algebraic Riccati equation can be solved using Newton iteration. For dense, unstructured data, the Schur method is usually the method of choice. However, the situation changes when an approximate solution is available. In this case Newton or Quasi-Newton methods may be computationally efficient compared to the Schur method. Using this approach, the present invention uses results of previous algebraic equations in iterative refinement procedures. Also, eigenvalue decompositions are saved and reused to compute frequency response. For one embodiment, results of previous simulations are also used in waveform relaxation.

The impact of computational delays is reduced in embodiments of the present invention by providing the user with a priori estimates of time required to complete a requested task. These estimates are based on order-based complexity and empirical analysis of elapsed time.

Typical order-based techniques estimate complexity based on an integer parameter n which represents the size of the problem. For example, a matrix-matrix multiplication takes $n^3$ operations. Table 1 lists operation counts for various methods for model reduction. Similar order-based operation counts are available for the LINPACK and EISPACK algorithms that form the core of most control design tools. See, for example, Laub, A. J., *Numerical Linear Algebra Aspects of Control Design Computations*, IEEE Trans. Auto Cntl., February 1985. The present invention includes a comprehensive database of such operation counts for the computational steps in the entire design cycle. This database is also used in bounding metrics or costs of paths in the design activity as previously described.

These operation counts do not directly give estimates for elapsed time because computational characteristics vary greatly among computing platforms. According to embodiments of the present invention, empirical analyses of various computing platforms was conducted and the results combined with operation counts to derive realistic estimates for elapsed time.

In various embodiments of the present invention, alternate techniques are employed to mitigate the impact of computational delays. For example, approximate solutions are available according to one embodiment. The user may want a faster answer than a tool can provide and may be willing to settle for an approximate answer. To address these instances, alternate algorithms are provided to accomplish this task. Table 5 is an illustration of the tradeoffs between accuracy and speed in computing eigenvalues using well-known methods.

TABLE 5

| | | | |
|---|---|---|---|
| | QR | most accurate | slowest |
| | subspace iteration | less accurate | faster |
| Eig (A) | Power Method | yet less accurate | yet faster |
| | Greshgorin bounds | least accurate | fastest |

Parallel algorithms are available in one embodiment for exploiting distributed computing to compute various functions when one algorithm may be more efficient than another. Parallel algorithms are discussed in Pandey, P., C. Kenney, and A. J. Laub, *A Parallel Algorithm for the Matrix Sign Function*, Int'l. J. High Speed Computing, June 1990. Users often perform complex computations to get answers that can be obtained by simpler means. For example, the question, "Is this system stable?" can be answered without computing all the eigenvalues. A possible alternative is the matrix sign function. By making parallel algorithms available, computing time is saved.

In one embodiment, precomputing is used to anticipate future actions and perform calculations related to the future actions during idle time. The future actions are anticipated based on the design structure. For example, the modal form of a system may be precomputed.

In embodiments of the present invention, intermediate results that can be reused will be saved internally. For example, consider frequency response calculations and suppose that software internally computes the modal form to compute this response. Most existing tools will recompute the modal form each time the command is issued even if the system matrix has not been changed. Storing intermediate results can lead to significant computational savings.

Embodiments of the present invention improve reliability of numerical computations. Numerical procedures for basis linear control computations have been described in Petkov, P. Hr., Christov, N. D., and Konstantinov, M. M., *Computational Methods for Linear Control Systems*, Prentice Hall International (UK), 1991.

A typical design iteration consists of many steps and substeps. The final design is a result of several such iterations. Lack of reliability in a step or substep is compounded in the design process. These issues become more significant as the size of the problem increases. Current tools are generally not reliable for n>150, whereas many problems arising in common domains of interest exceed these dimensions. For example, finite difference models arising from heat equations may have hundreds of states. Models that include other phenomena such as diffusion, convection and advection, are even larger. Lack of numerical reliability can severely limit applicability of a tool. Experts in numerical methods can overcome these problems, but not process experts or even control experts. The present invention employs several methods to increase the reliability of numerical computations.

One technique employed by the present invention to increase reliability of numerical computations is provision of multiple methods. Many standard mathematical software packages provide just one or two solvers for Riccati equations, frequency response, matrix exponential, and Lyapunov solution. Multiple procedures are useful when there is no obvious universal choice and when redundancy is required to counter inevitable programming bugs that change from one release to the next. The present invention also includes an a priori condition estimator. These estimates are used in one embodiment in a search of the state space graph for an optimal design strategy, and incorporate the bounded metrics of the state space graph.

In one embodiment, independent error computations and checks are provided. Such checks are added at the end of each design step and at the end of major substeps. For example, after the Riccati solver computes the optimal gain and the Riccati matrix, independent tests of residual errors and closed loop eigenvalues can be made. By making test code open and independent of computation code, common programming bugs are detected by test software. For example, in thermal conduction-radiation simulation models, it has been found that the following tests are useful: 1) tests of energy conservation around selected enclosures; 2) minimum phase response of temperatures to steps in heater powers; 3) limiting temperature should be equal to the ambient temperature with no power to heaters; and 4) all eigenvalues of the linearized open loop system should be real.

FIGS. 7, 8, 9*a*, and 9*b* show screens of a graphical user interface according to one embodiment of the present invention for designing a controller for hot-wall thermal reactors, or furnaces, as used in the semiconductor industry. In this embodiment, the graphical user interface screens display only relevant information to the process expert user. Displaying control-theoretic information such as Bode plots and root-loci in their usual form are not meaningful to such users. For diffusion furnaces, for example, a pictorial display of the furnace with attached temperatures and powers is very useful. Temperature-time response histories, predicted wafer thickness variations, radiosities, losses and power histories are physically more meaningful than frequency responses in decibels on log plots or Nyquist diagrams. Results of intermediate design calculations are transformed into physically meaningful forms.

Figure 7:
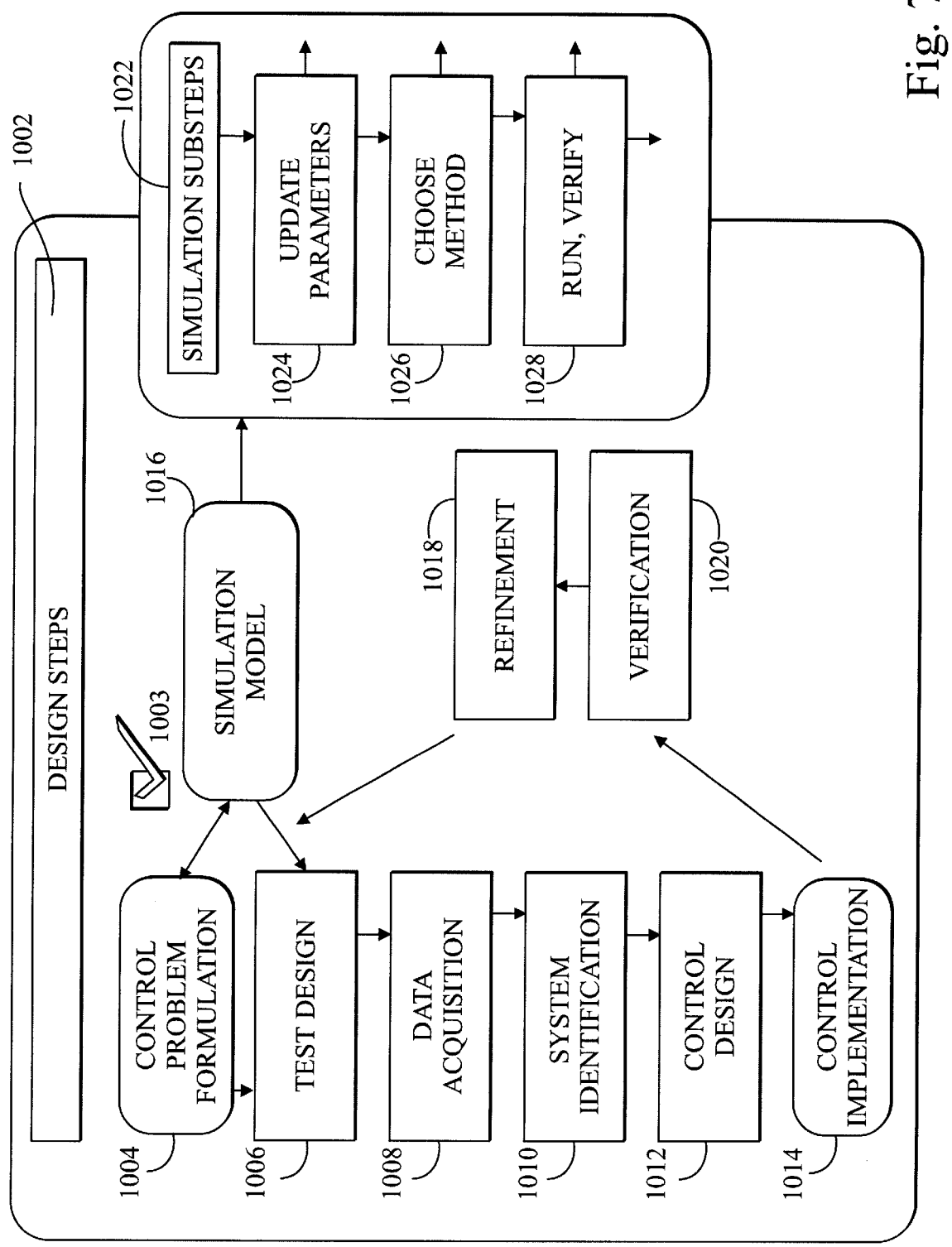
FIG. 7 is an illustration of an interface screen of one embodiment that includes a menu for navigating the design steps.

FIG. 7 shows one interface screen in this embodiment that includes menu 1000 for navigating the design steps. Design step window 1002 is a graphical representation of the progress of the design. Control problem formulation button 1004, test design button 1006, data acquisition button 1008, system identification button 1010, control design button 1012, control implementation button 1014, verification button 1020, refinement button 1018 and simulation button 1016 are named after steps in the design. These buttons are pressed to cause the named step to be automatically executed. Arrows between buttons indicate possible transitions from one steps to another. Check mark 1003 indicates that the control problem formulation step activated by button 1004 is complete. Simulation model button 1016 is highlighted to indicate the currently active step.

Simulation substeps window 1022 indicates the substeps in the simulation model step 1016. Update parameters button 1024, choose method button step 1026, and run, verify button 1028 activate substeps in the simulation model substep.

FIG. 8 show another screen 2000 for this embodiment that displays design information for hot-wall thermal furnaces. Furnace 2020 is represented with colors that are coded to show temperatures in different parts of an actual controlled furnace at different times. Corresponding oxide thickness 2024 is shown as a function of axial and radial position in the furnace. Graphical plots 2028 show the temperatures of components as a function of time. Plots 2026 show heater powers as a function of time. Plots 2032 show heat losses as a function of time. Design plan 2030 is a graphical representation of the current status of the execution of the planned design activity.

Figure 9A:
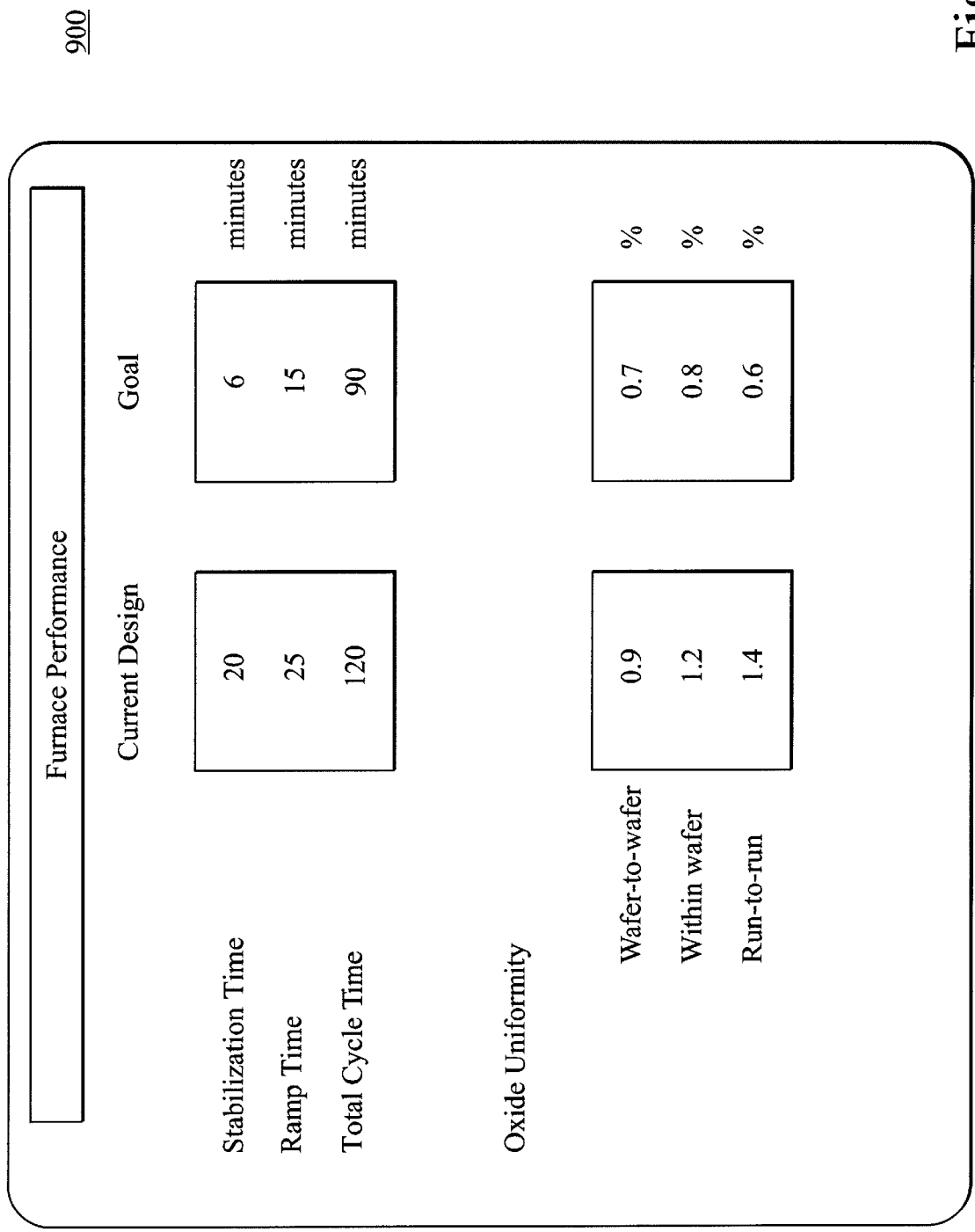
FIG. 9a is an is an illustration of an interface screen of one embodiment that displays application-specific information.

FIG. 9*a* shows user screen 900 which tabulates furnace performance information. The furnace performance screen includes information related directly to the furnace, such as stabilization time, ramp time and total cycle time. The furnace performance screen also includes information relating to product characteristics, such as oxide uniformity wafer-to-wafer, oxide uniformity within a wafer, and oxide uniformity run-to-run. Each piece of information displayed is quantified in terms of the current design and in terms of the goal of the design activity.

FIG. 9*b* shows user screen 902 which is a project sheet including tabulated project information. User screen 902 includes furnace test time, engineering time, and elapsed project time required and expended. User screen 902 also includes real-time CPU loading in terms of both the current design and a limit.

The present invention has been described in terms of specific exemplary embodiments. For example, various aspects of an embodiment that is used for designing a control system for a thermally activated process have been described as examples. Other embodiments of the present invention are used for design of other processes with various modifications and alterations that might be made by those skilled in the art without departing from the spirit and scope of the invention as set forth in the following claims.

What is claimed is:

1. A method for computer-aided design comprising the steps of:
   representing a computer-aided design activity as a design cycle;
   defining a goal of the design activity;
   defining a first design step toward achieving the goal;
   defining an alternate design step toward achieving the goal;
   assigning a cost metric for each of the first design step and the alternate design step;
   estimating relative costs and bounds on the cost metric; and
   optimizing a cost of achieving the goal.

2. The method of claim 1, further comprising the step of:
   representing the design activity as a graph containing the first design step and the alternate design step.

3. The method of claim 2, wherein the step of estimating element values and bounds on the cost metric is performed by searching the graph to project costs incurred upon execution of the first design step and the alternate design step to achieve the goal.

4. The method of claim 2, wherein the graph is a state space graph comprising a plurality of design states, each including a plurality of alternative design substeps and outcomes of the plurality of alternative design substeps.

5. The method of claim 1, wherein the step of assigning a cost metric includes elements representing relative costs of taking each of a plurality of paths in the graph.

6. The method of claim 1, wherein the step of optimizing a cost of achieving the goal is performed by selecting one of the first design step and the alternate design step associated with a smallest cost metric.

7. The method of claim 1, further comprising the steps of:
   executing the design cycle, including,
      receiving an actual cost metric element value during execution;
      replacing an estimated value of the cost metric element with the actual value;
      reestimating bounds on the cost metric using the actual value; and
      reoptimizing the cost of achieving the goal.

8. The method of claim 7, further comprising the steps of:
   receiving an indication of whether accuracy or speed is a more important design criterion; and
   using the indication in the step of reoptimizing.

9. The method of claim 1, wherein the design cycle requires a plurality of iterations, and wherein the step of optimizing includes performing calculations using an incremental algorithm that uses results of calculations related to one iteration of the plurality of iterations in calculations related to subsequent iterations of the plurality of iterations.

10. The method of claim 1, further comprising the steps of:
    receiving an indication of whether accuracy or speed is a more important design criterion; and
    using the indication in the step of optimizing.

11. The method of claim 1, wherein the cost metric comprises an interaction complexity that is a quantification of an amount of information to be processed by the user for a transaction between the user and a user interface.

12. The method of claim 1, wherein the cost metric comprises a computational complexity that is an indication of a number of computational operations to be performed in a computational task.

13. The method of claim 1, wherein the cost metric comprises a computational response time that indicates a time for a machine to complete a computation.

14. The method of claim 1, wherein the cost metric comprises a number of required user decisions in an interaction between a user and a user interface.

15. The method of claim 1, wherein the cost metric comprises an equipment test time.

16. The method of claim 1, wherein the cost metric comprises an estimate of numerical reliability that is an indication of numerical accuracy of results and sensitivity to numerical input errors.

17. The method of claim 1, further comprising the step of independently computing an error computation.

18. A method for designing a signal processing system that is represented as a design cycle, comprising the steps of:
    using the design cycle representation to create a plurality of alternate process steps toward achieving a predefined goal of the signal processing system;
    assigning cost metrics to each of the alternate process steps;
    estimating a range of values for each of the assigned cost metrics; and
    optimizing a cost of achieving the predefined goal.

19. The method of claim 18, wherein the plurality of alternate process steps are contained in a graph.

20. The method of claim 19, wherein the step of assigning cost metrics is performed using a plurality of paths between the alternate process steps on the graph.

21. The method of claim 20, wherein the step of estimating a range of values is performed based upon projected execution of each of the plurality of paths.

22. The method of claim 20, wherein the step of optimizing the cost of achieving the predefined goal is performed by selecting one of the plurality of paths associated with a smallest cost metric of the assigned cost metrics.

23. The method of claim 19, wherein the graph is a state space graph and wherein at least one of the plurality of alternate process steps comprises a plurality of alternate methods by which the process step is accomplished, further including the step of choosing a method of the alternate methods.

24. The method of claim 23, further comprising the steps of:
    performing at least one iteration of the design cycle using the optimized cost;
    during an iteration of the design cycle, receiving at least one actual value for at least one of the assigned cost metrics;
    replacing the estimated range of values for the assigned cost metric with the actual value;
    reestimating a range of values for remaining assigned cost metrics; and reoptimizing the cost of achieving the predefined goal.

25. The method of claim 24, further comprising the steps of:
   receiving an indication of whether accuracy or speed is a more important design criterion; and
   using the indication in the step of reoptimizing.

26. The method of claim 18, further comprising the steps of:
   receiving an indication of whether accuracy or speed is a more important design criterion; and
   using the indication in the step of optimizing.

27. The method of claim 18, wherein the cost metrics comprise an interaction complexity that is a quantification of an amount of information to be processed by the user for a transaction between the user and a user interface.

28. The method of claim 18, where in the cost metrics comprise a computational complexity that is an indication of a number of computational operations to be performed in a computational task.

29. The method of claim 18, where in the cost metrics comprise a computational response time that indicates a time for a machine to complete a computation.

30. The method of claim 18, wherein the cost metrics comprise a number of required user decisions in an interaction between a user and a user interface.

31. The method of claim 18, wherein the cost metrics comprise an equipment test time.

32. The method of claim 18, wherein a cost metric comprises an estimate of numerical reliability that is an indication of numerical accuracy of results and sensitivity to numerical input errors.

33. The method of claim 18, further comprising the step of independently computing an error computation.

34. The method of claim 18, wherein the process is the thermally activated process of silicon oxide growth carried out in an oxidation furnace, and wherein the signal processing system controls the oxidation furnace.

35. The method of claim 34, further comprising the steps of:
   during execution of the design cycle, receiving measured values for physical properties of the process; and
   converting the measured values to visual representations for display on a computer display including graphical representations and pictorial representations.

36. The method of claim 35, further comprising the steps of:
   displaying representations of design steps in the design cycle on the computer display;
   receiving an indication from a user of a design step of the design steps to be executed.

37. The method of claim 36, further comprising the step of displaying a representation of the cost metrics on the computer display.

38. A computer readable medium having stored thereon instructions which when executed cause the computer to perform the steps of:
   converting a design cycle that characterizes a design activity into a plurality of alternate process steps for achieving a predefined goal of the design activity;
   assigning estimated cost metrics to the alternate process steps;
   executing the design cycle for at least one iteration;
   replacing associated estimated cost metrics with actual cost metrics; and
   using the actual cost metrics to calculate new estimated cost metrics.

39. The medium of claim 38, wherein the plurality of alternate process steps are contained in a graphical representation.

40. The medium of claim 39, wherein the estimated cost metrics are assigned between paths of the alternate process steps on the graph.

41. The computer readable medium of claim 40, wherein the steps performed further comprise:
   optimizing the design cycle by selecting paths between the alternate process steps are assigned smaller estimated cost metrics;
   receiving an indication of whether accuracy or speed is a more important design criterion; and
   using the indication in the step of optimizing.

42. The computer readable medium of claim 41, wherein at least one of the process steps can be accomplished by a plurality of methods, and where the step of optimizing includes considering different costs of accomplishing the process step using different methods of the plurality of methods.

43. The medium of claim 38, wherein in the step of replacing associated estimated cost metrics with actual cost metrics is performed as process steps are completed in an iteration of the design cycle.

* * * * *

UNITED STATES PATENT AND TRADEMARK OFFICE
CERTIFICATE OF CORRECTION

PATENT NO. : 6,289,255 B1
DATED : September 11, 2001
INVENTOR(S) : Shah et al.

It is certified that error appears in the above-identified patent and that said Letters Patent is hereby corrected as shown below:

Column 4,
Line 43, delete "606" and replace with -- 604 --.
Line 67, delete "$H_2, H$" and replace with -- $H_2, H_\infty$ --.

Column 5,
Line 11, delete "$H_2, H$" and replace with -- $H_2, H_\infty$ --.

Column 9,
Line 25, delete "H" and replace with -- $H_\infty$ --.

Signed and Sealed this

Sixth Day of August, 2002

Attest:

Attesting Officer

JAMES E. ROGAN
Director of the United States Patent and Trademark Office